(12) United States Patent
Tu (10) Patent No.: US 9,368,600 B2
(45) Date of Patent: Jun. 14, 2016

(54) SEMICONDUCTOR DEVICE AND MANUFACTURING METHOD THEREOF

(71) Applicant: Semiconductor Manufacturing International (Shanghai) Corporation, Shanghai (CN)

(72) Inventor: Ajin Tu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/582,917

(22) Filed: Dec. 24, 2014

(65) Prior Publication Data

US 2015/0236125 A1    Aug. 20, 2015

(30) Foreign Application Priority Data

Feb. 14, 2014    (CN) .......................... 2014 1 0051861

(51) Int. Cl.
| | |
|---|---|
| *H01L 21/265* | (2006.01) |
| *H01L 29/66* | (2006.01) |
| *H01L 29/78* | (2006.01) |
| *H01L 29/161* | (2006.01) |
| *H01L 29/167* | (2006.01) |
| *H01L 29/165* | (2006.01) |

(52) U.S. Cl.
CPC ........ *H01L 29/66636* (2013.01); *H01L 29/161* (2013.01); *H01L 29/165* (2013.01); *H01L 29/167* (2013.01); *H01L 29/7848* (2013.01); *H01L 21/26513* (2013.01)

(58) Field of Classification Search
CPC ............ H01L 29/7842; H01L 29/0847; H01L 29/66636; H01L 29/7848; H01L 21/02532
See application file for complete search history.

(56) References Cited

U.S. PATENT DOCUMENTS

| | | | | |
|---|---|---|---|---|
| 7,172,933 | B2 * | 2/2007 | Huang | .............. H01L 29/41783 257/E21.419 |
| 7,176,481 | B2 * | 2/2007 | Chen | ............... H01L 21/823807 257/19 |
| 7,456,087 | B2 * | 11/2008 | Cheng | ................... H01L 29/165 257/E21.001 |
| 2008/0067609 | A1 * | 3/2008 | Kim | ...................... H01L 29/165 257/384 |
| 2009/0101942 | A1 * | 4/2009 | Dyer | ................. H01L 21/30608 257/288 |
| 2009/0166625 | A1 * | 7/2009 | Ting | .................... H01L 29/7848 257/51 |
| 2009/0261349 | A1 * | 10/2009 | Lee | ..................... H01L 29/0847 257/77 |
| 2009/0273034 | A1 * | 11/2009 | Woon | ................ H01L 21/26506 257/368 |
| 2015/0221648 | A1 * | 8/2015 | Gimbert | ............. H01L 27/0922 257/351 |

* cited by examiner

*Primary Examiner* — Mohsen Ahmadi
(74) *Attorney, Agent, or Firm* — Innovation Counsel LLP (57) ABSTRACT

A method of manufacturing a semiconductor device is provided. The method includes forming a plurality of trenches in a semiconductor substrate, on opposite sides of a gate electrode of a P-type metal-oxide-semiconductor (PMOS) disposed on the semiconductor substrate. The method further includes forming an embedded silicon germanium layer inside the trenches, and forming a capping layer on the embedded silicon germanium layer, wherein the embedded silicon germanium layer and the capping layer are doped with boron (B).

6 Claims, 9 Drawing Sheets

SEMICONDUCTOR DEVICE AND MANUFACTURING METHOD THEREOF

CROSS-REFERENCE TO RELATED APPLICATION

This application claims priority to Chinese Patent Application No. 201410051861.2 filed on Feb. 14, 2014, the disclosure of which is incorporated herein by reference in its entirety.

BACKGROUND

1. Technical Field

The present disclosure relates to the field of semiconductor technology, and more particularly to a semiconductor device and manufacturing method thereof.

2. Description of the Related Art

In the field of semiconductor technology, for advanced complementary metal-oxide-semiconductor (CMOS) logic devices, stress engineering is one of the most important factors in improving device performance. For example, in a P-type metal-oxide-semiconductor (PMOS) device, the compressive stress on the channel can be increased by forming an epitaxial silicon germanium source and drain, thereby increasing carrier mobility.

During the fabrication of the device, ion implantation is typically performed on the source and drain regions of the PMOS. However, in some instances, the ion implantation can cause damage to the lattice arrangement of the embedded silicon germanium layer, which releases a significant amount of the compressive stress that is applied by the embedded silicon germanium layer onto the channel of the PMOS. The release of the compressive stress reduces carrier mobility, thereby lowering the performance of the PMOS device.

SUMMARY

The present disclosure addresses at least the above issues in the prior art relating to the release of compressive stress due to ion implantation.

According to one embodiment of the inventive concept, a method of manufacturing a semiconductor device is provided. The method includes forming a plurality of trenches in a semiconductor substrate, on opposite sides of a gate electrode of a P-type metal-oxide-semiconductor (PMOS) disposed on the semiconductor substrate. The method further includes forming an embedded silicon germanium layer inside the trenches, and forming a capping layer on the embedded silicon germanium layer, wherein the embedded silicon germanium layer and the capping layer are doped with boron (B).

According to another embodiment of the inventive concept, a semiconductor device is provided. The semiconductor device includes: a semiconductor substrate, a P-type metal-oxide-semiconductor (PMOS) disposed on the semiconductor substrate, an embedded silicon germanium layer disposed on opposite sides of a gate electrode of the PMOS, and a capping layer disposed on the embedded silicon germanium layer, wherein the embedded silicon germanium layer and the capping layer are doped with boron (B).

In one embodiment, an atomic percentage of germanium (Ge) in the embedded silicon germanium layer may range from about 30% to about 50%.

In one embodiment, a dopant concentration of boron (B) in the embedded silicon germanium layer may range from about $5 \times 10^{19}$ cm$^{-3}$ to about $3 \times 10^{20}$ cm$^{-3}$.

In one embodiment, forming the embedded silicon germanium layer may further include forming the embedded silicon germanium layer using a selective epitaxy method at temperatures ranging about 500° C. to about 800° C. and at pressures ranging from about 1 Torr to about 100 Torr.

In one embodiment, the selective epitaxy method may include using reactive gases comprising SiH$_4$, HCl, B$_2$H$_6$, GeH$_4$, or H$_2$, and wherein a gas flow rate of the SiH$_4$, HCl, B$_2$H$_6$, or GeH$_4$ ranges from about 1 sccm to about 1000 sccm, and a gas flow rate of the H$_2$ ranges from about 0.1 slm to about 50 slm.

In one embodiment, the selective epitaxy method may include using reactive gases comprising DCS (SiH$_2$Cl$_2$), HCl, B$_2$H$_6$, GeH$_4$, or H$_2$, and wherein a gas flow rate of the DCS (SiH$_2$Cl$_2$), HCl, B$_2$H$_6$, or GeH$_4$ ranges from about 1 sccm to about 1000 sccm, and a gas flow rate of the H$_2$ ranges from about 0.1 slm to about 50 slm.

In one embodiment, the capping layer may be doped with germanium (Ge).

In one embodiment, an atomic percentage of germanium (Ge) in the capping layer may range from about 1% to about 10%.

In one embodiment, a dopant concentration of boron (B) in the capping layer may range from about $5 \times 10^{19}$ cm$^{-3}$ to about $2 \times 10^{20}$ cm$^{-3}$.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

First, a method of manufacturing a semiconductor device is described with reference to FIGS. 1A through 1D. Specifically, the method can be applied to stress engineer a PMOS device. FIGS. 1A through 1D depict schematic cross-sectional views of the semiconductor device at different stages of manufacture. The method includes steps E1 through E4, described below.

Figure 1A:
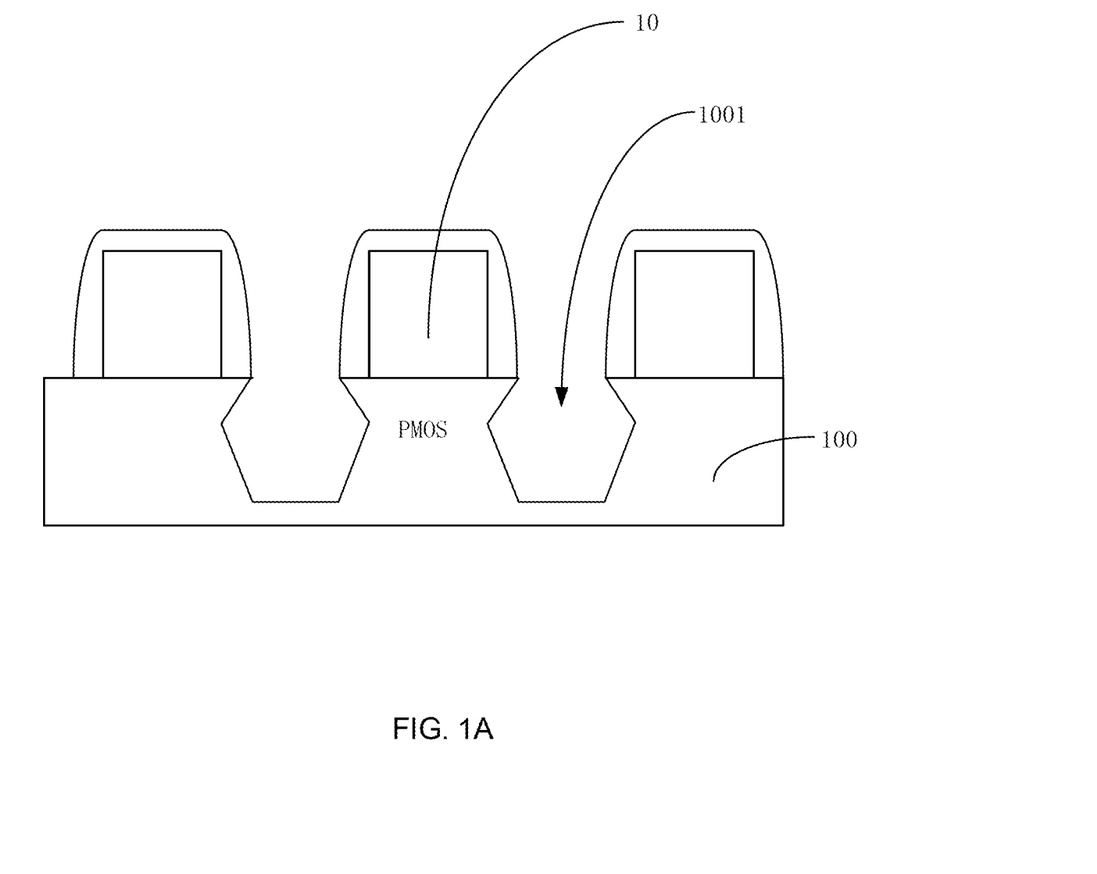
FIGS. 1A, 1B, 1C, and 1D depict schematic cross-sectional views of a semiconductor device at different stages of manufacture.

In Step E1, trenches 1001 are formed in a semiconductor substrate 100, on opposite sides of a gate electrode 10 of a PMOS, as shown in FIG. 1A. An embedded silicon germanium layer 101 is to be formed within the trenches 1001, as described later in Step E2. The trenches 1001 may be formed having a bowl shape, a $\Sigma$ (sigma) shape, or any other shape.

Figure 1B:
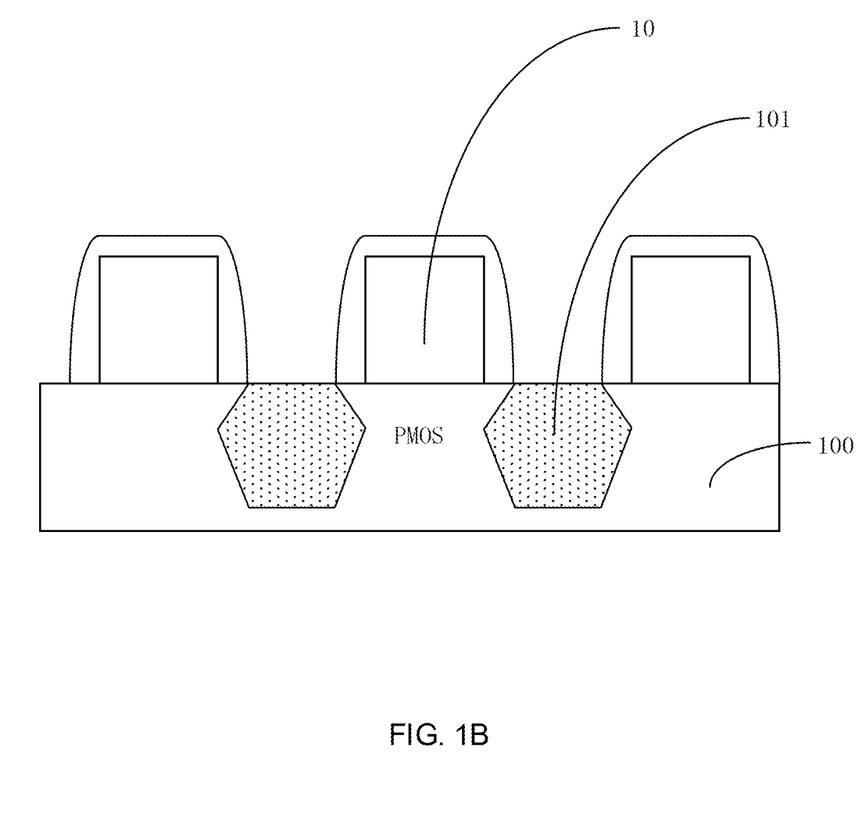

In Step E2, an embedded silicon germanium layer 101 is formed inside the trenches 1001, as shown in FIG. 1B. The embedded silicon germanium layer 101 may be doped with boron (B). The embedded silicon germanium layer 101 may be formed (grown) using a selective epitaxy method.

Figure 1C:
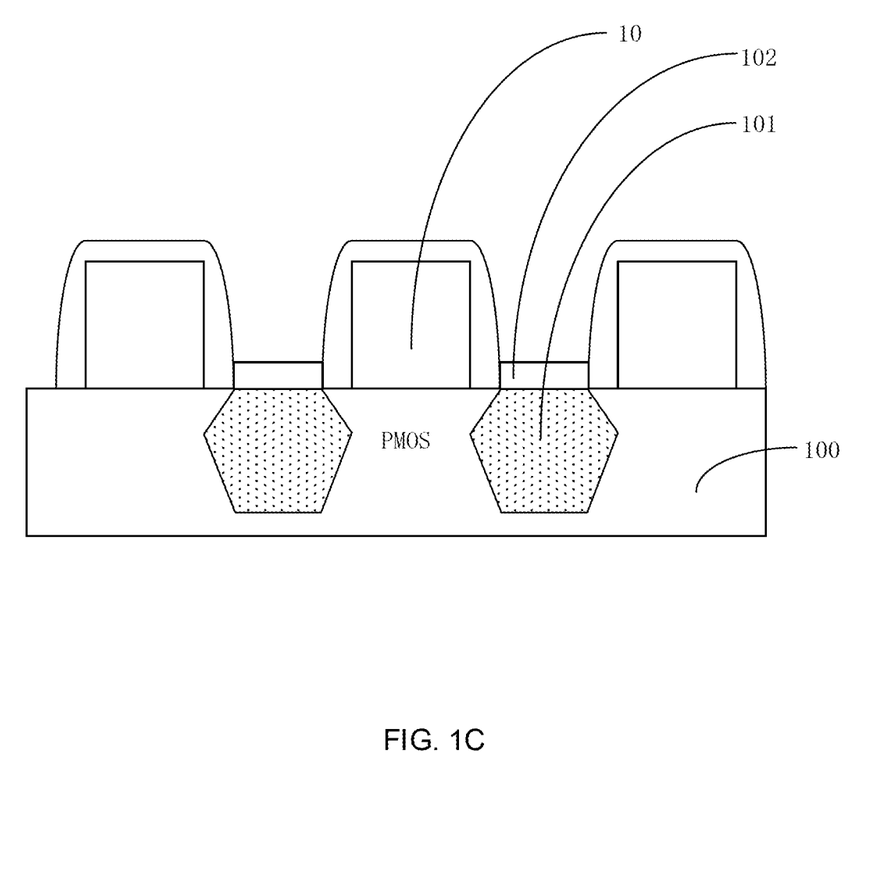

In Step E3, a capping layer 102 is formed on top of the embedded silicon germanium layer 101, as shown in FIG. 1C. The capping layer 102 is typically made of undoped silicon.

Figure 1D:
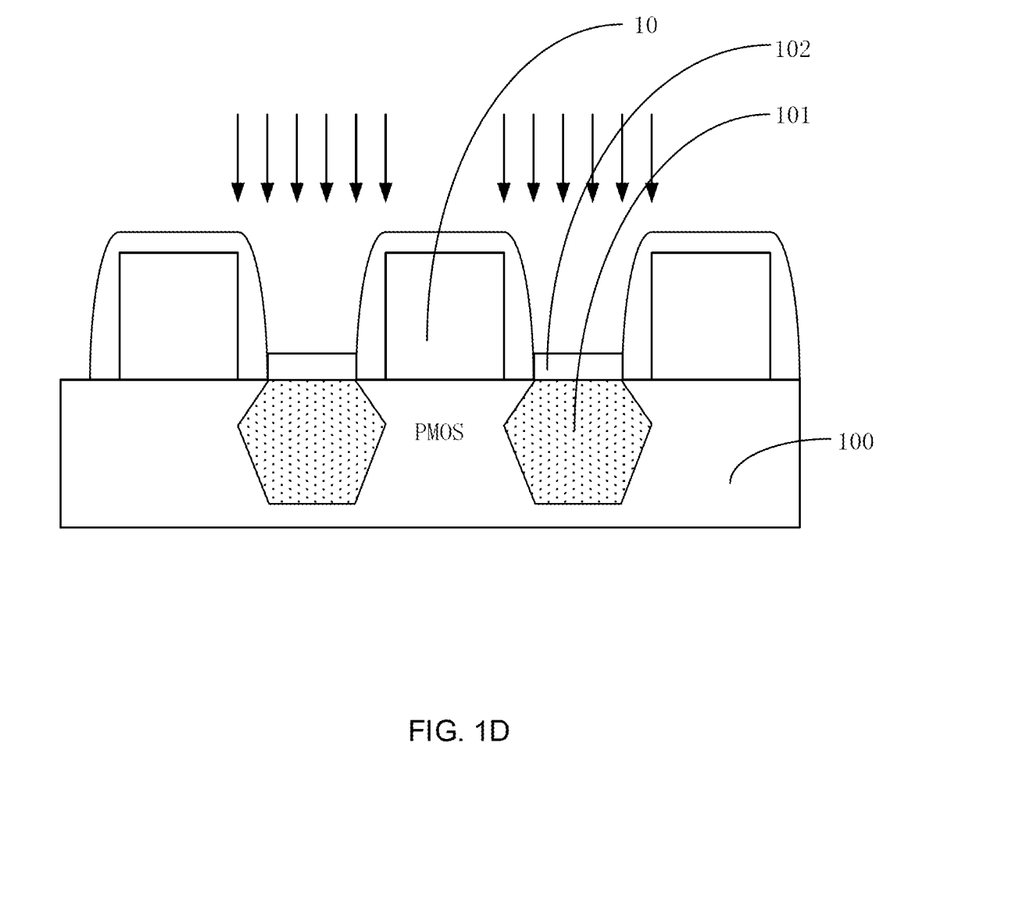

In Step E4, ion implantation and annealing are performed on the source and drain regions of the PMOS, as shown in FIG. 1D. The downward arrows in FIG. 1D indicate the direction of the ion implantation. The ion implantation can be used to adjust the carrier concentrations in the PMOS source and drain regions. The annealing is performed after the ion implantation, and serves primarily to activate the implanted ions.

Figure 2A:
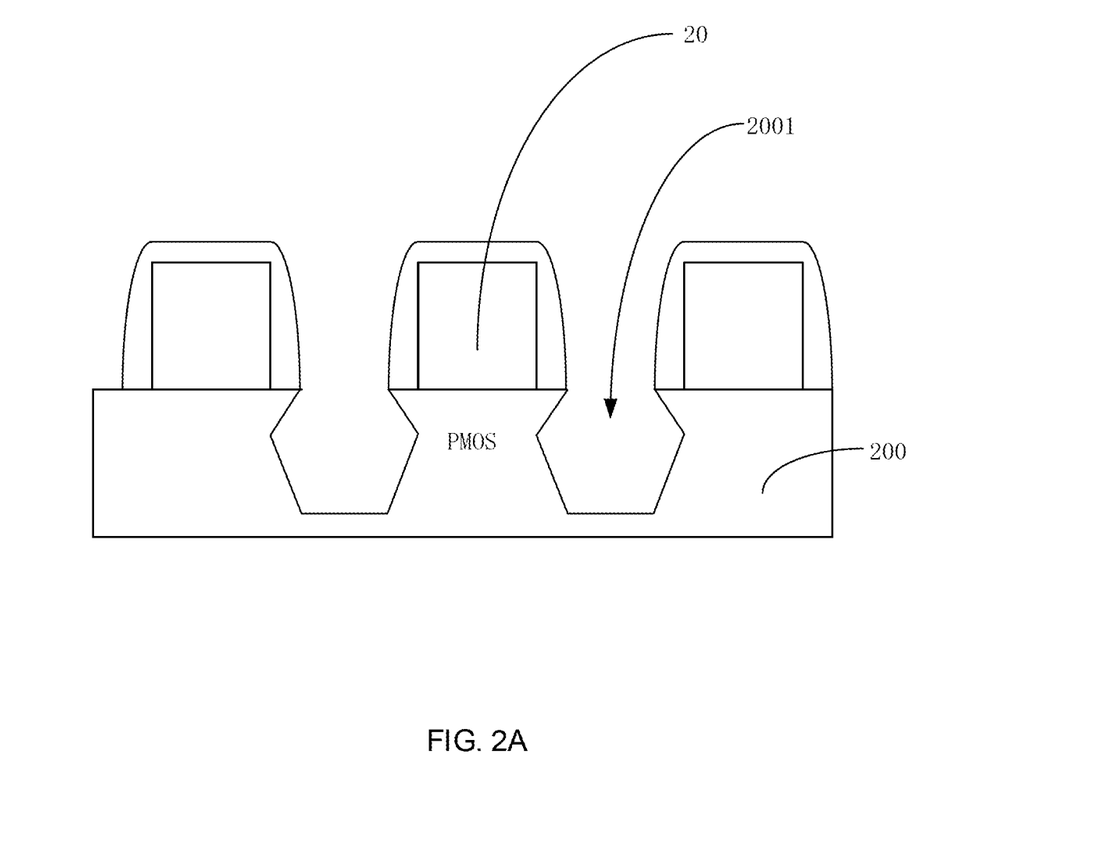
FIGS. 2A, 2B, and 2C depict schematic cross-sectional views of a semiconductor device at different stages of manufacture according to an embodiment.
Figure 2B:
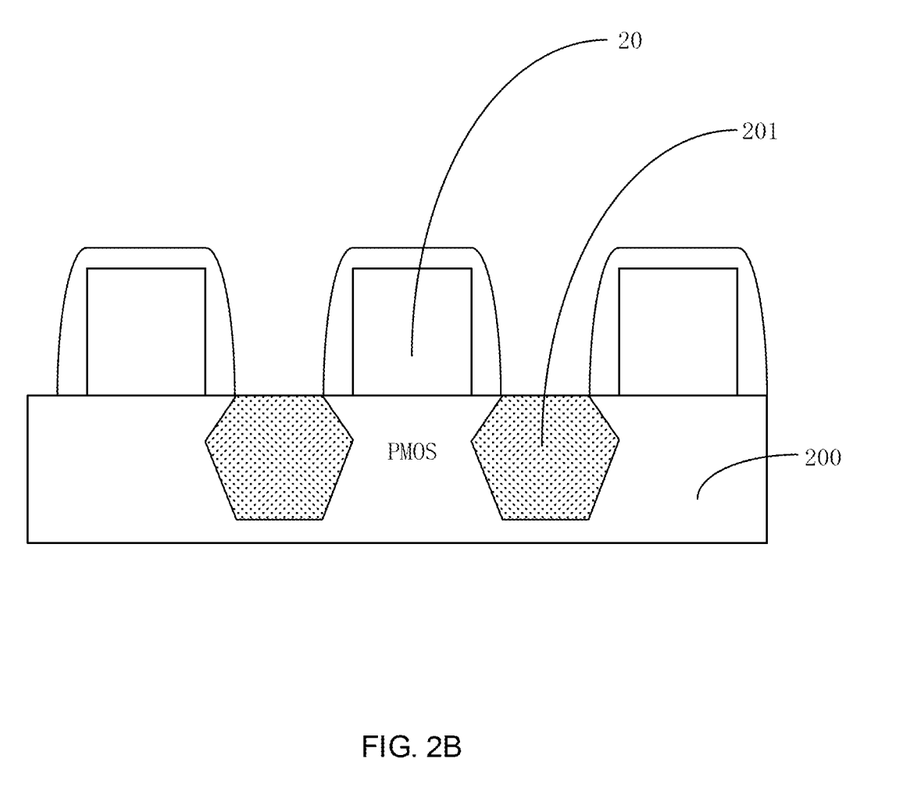
Figure 2C:
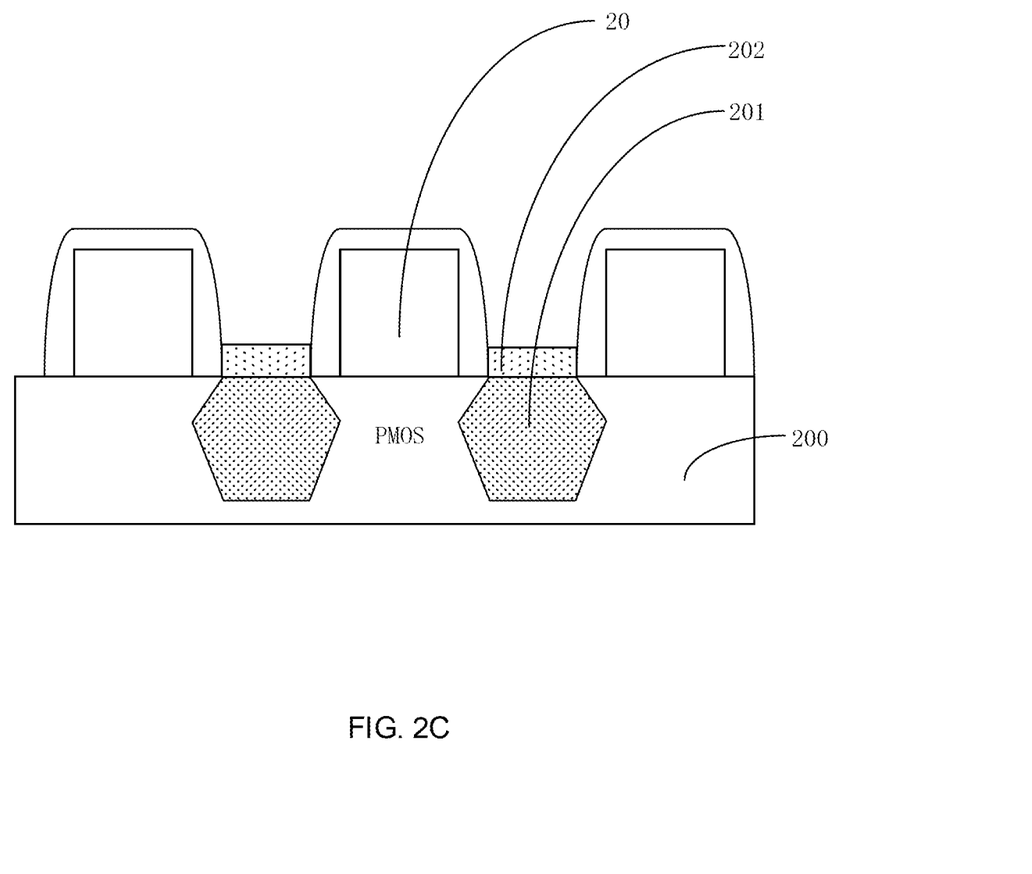
Figure 3:
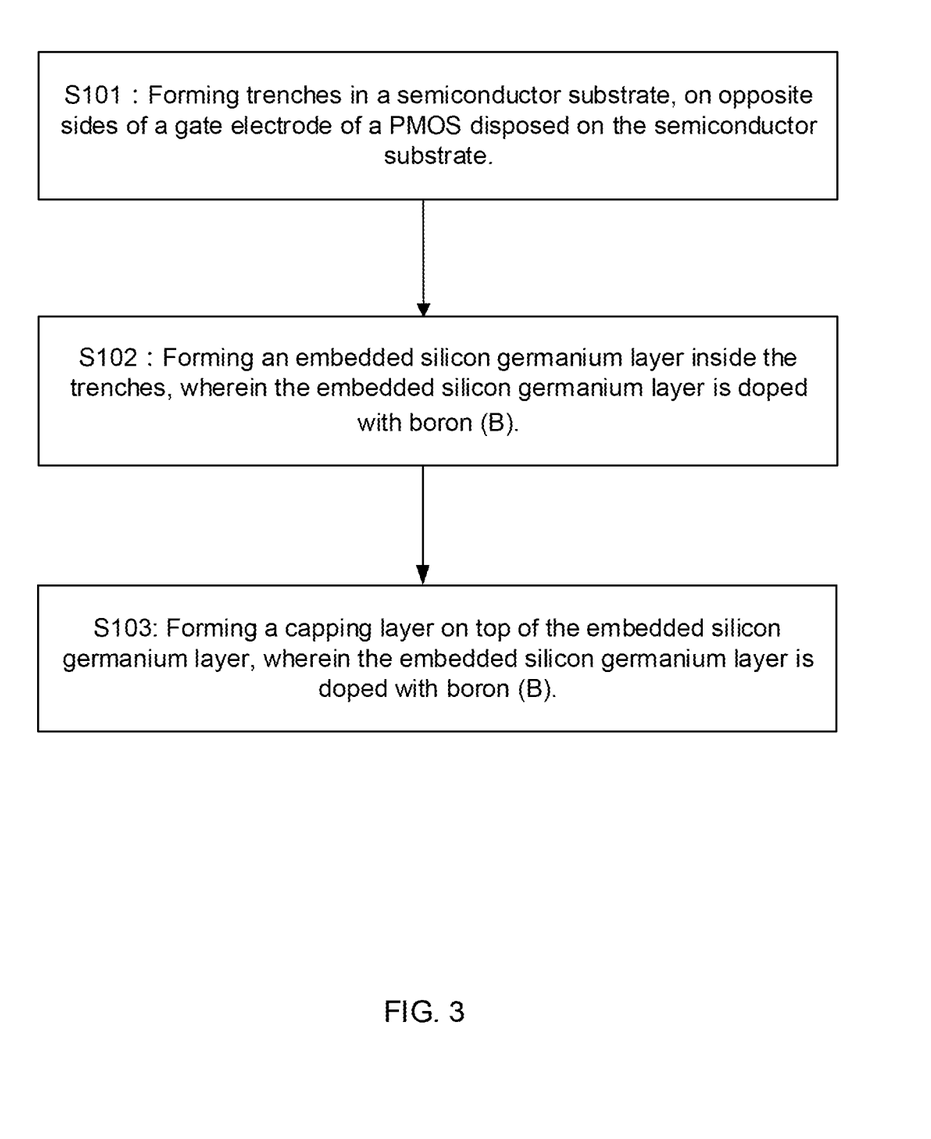
FIG. 3 is a flowchart illustrating an exemplary method of manufacturing the semiconductor device of FIGS. 2A, 2B, and 2C.

Next, a method of manufacturing a semiconductor device according to an embodiment will be described in detail with reference to FIGS. 2A though 2C and FIG. 3. Specifically, FIGS. 2A, 2B, and 2C depict schematic cross-sectional views of the semiconductor device at different stages of manufacture. FIG. 3 is a flowchart of the exemplary method for manufacturing the semiconductor device of FIGS. 2A, 2B, and 2C. The method includes the following steps.

In Step S101, trenches 2001 are formed in a semiconductor substrate 200, on opposite sides of a gate electrode 20 of a PMOS, as shown in FIG. 2A. An embedded silicon germanium layer 2002 is to be formed within the trenches 2001, as described later in Step S102. The trenches 2001 may be formed having a bowl shape, a $\Sigma$ (sigma) shape, or any other shape. The trenches 2001 may be formed using dry etching, wet etching, a combination of dry and wet etching (e.g. dry etching followed by wet etching), or any other appropriate etching techniques.

It should be noted that prior to Step S101, components such as dummy gate structures, gate structures, and/or other circuit elements may be formed on the semiconductor substrate 200.

In Step S102, an embedded silicon germanium layer 201 is formed inside the trenches 2001, as shown in FIG. 2B. In one embodiment, the embedded silicon germanium layer 201 is doped with boron (B).

The embedded silicon germanium layer 201 in the embodiment of FIG. 2B has a different atomic percentage of germanium (Ge) compared to the embedded silicon germanium layer 101 of FIG. 1B. Specifically, the embedded silicon germanium layer 201 (in FIG. 2B) has a higher atomic percentage of Ge than the embedded silicon germanium layer 101 (in FIG. 1B). In one embodiment, the atomic percentage of Ge in the embedded silicon germanium layer 201 ranges from about 30% to about 50%. The embedded silicon germanium layer 201 also has higher boron (B) content relative to the embedded silicon germanium layer 101. In one embodiment, the dopant concentration of boron (B) in the embedded silicon germanium layer 201 ranges from about $5\times10^{19}$ cm$^{-3}$ to about $3\times10^{20}$ cm$^{-3}$.

The embedded silicon germanium layer 201 may be formed (grown) using a selective epitaxy method or any other appropriate method. For example, in one embodiment, the embedded silicon germanium layer 201 may be formed using the selective epitaxy method at temperatures ranging about 500° C. to about 800° C. and at pressures ranging from about 1 Torr to about 100 Torr, using reactive gases including SiH$_4$ (or DCS: SiH$_2$Cl$_2$), HCl, B$_2$H$_6$, GeH$_4$ and H$_2$. The gas flow rate of the SiH$_4$, DCS, HCl, B$_2$H$_6$, and GeH$_4$ may range from about 1 sccm to about 1000 sccm; the gas flow rate of the H$_2$ may range from about 0.1 slm to about 50 slm. In the above, the unit "slm" refers to standard liters per minute, and the unit "sccm" refers to standard cubic centimeters per minute.

In Step S103, a capping layer 202 is formed on top of the embedded silicon germanium layer 201, as shown in FIG. 2C. The capping layer 202 in the embodiment of FIG. 2C is different from the capping layer 102 of FIG. 1C. In the embodiment of FIG. 2C, the capping layer 202 may be an in-situ boron-doped silicon capping layer. In contrast, the capping layer 102 is typically made of undoped silicon, as previously mentioned. In one embodiment, the dopant concentration of boron (B) in the capping layer 202 ranges from about $5\times10^{19}$ cm$^{-3}$ to about $2\times10^{20}$ cm$^{-3}$.

In one embodiment, to ensure that the capping layer 202 (comprising Si and B) is properly formed, the capping layer 202 may be further doped with a small amount of germanium (Ge). The dopant amount of the Ge has to be carefully controlled due to the large mismatch in lattice structure between silicon (Si) and boron (B) atoms. For example, the capping layer 202 may have a rough surface when doped with a large amount of Ge. However, if the capping layer 202 is doped with a small amount of Ge, the Ge atoms can be used to compensate for the lattice mismatch between the Si and B atoms, which results in the capping layer 202 having a smooth surface. In one embodiment, when the capping layer 202 is doped with a small amount of Ge, the atomic percentage of Ge in the capping layer 202 ranges from about 1% to about 10%.

According to the above exemplary method of manufacturing the semiconductor device, by doping the capping layer 202 (disposed on top of the embedded silicon germanium layer 201) with boron (B), the carrier concentration in the source and drain regions of the PMOS can be increased. As such, the embedded silicon germanium layer 201 and the capping layer 202 in the semiconductor device of FIG. 2C can directly serve as the source and drain regions of the PMOS. As a result, the ion implantation and annealing in Step E4 (FIG. 1D) can be omitted when using the above exemplary method. Since the exemplary method need not require the ion implantation and annealing steps, the process for forming the semiconductor device can be further simplified.

In the embodiment of FIG. 2C, the embedded silicon germanium layer 201 has a higher atomic percentage of germanium (Ge) than the embedded silicon germanium layer 101. Also, the capping layer 202 is doped with boron (B), unlike the capping layer 102 which is typically undoped. Accordingly, the carrier concentrations in the source and drain regions of the PMOS can be increased using the above exemplary method, thereby improving the performance of the PMOS device.

An exemplary method of manufacturing a semiconductor device according to an embodiment has been described above with reference to Steps S101 through S103. However, the inventive concept is not limited to the above and may include additional semiconductor processing steps known to those skilled in the art. For example, in one embodiment, additional steps may be added after Step S103. The additional steps may include forming dielectric layers and interconnects. Since the additional steps are known to those skilled in the art, a detailed description of those steps will be omitted.

Figure 4:
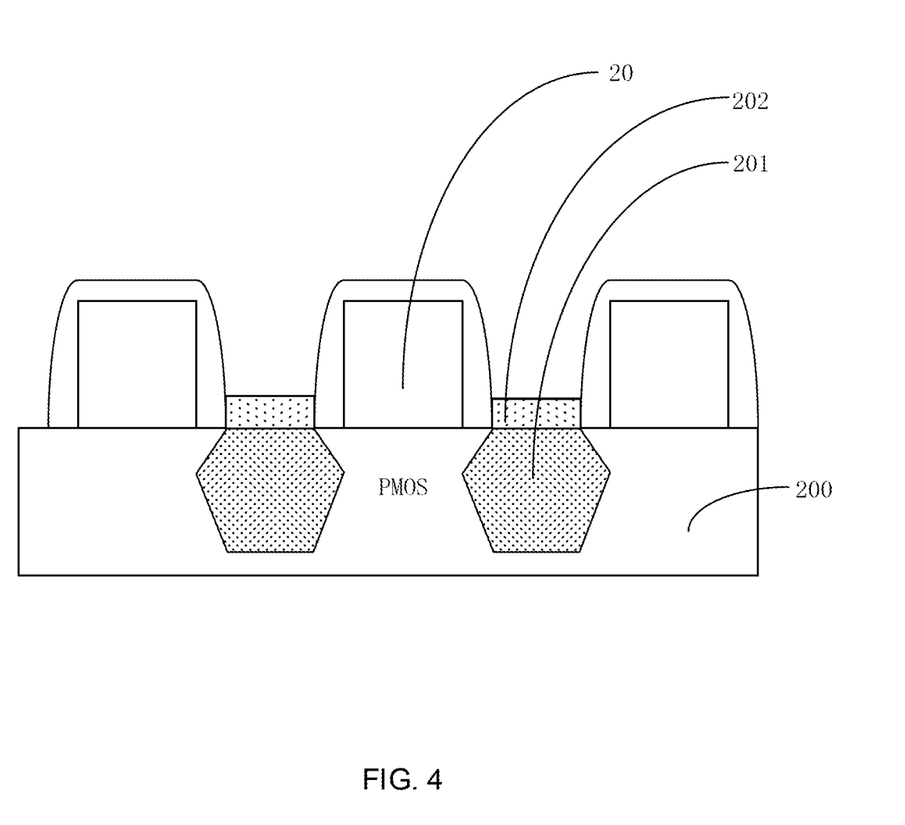
FIG. 4 depicts a schematic cross-sectional view of a semiconductor device according to an embodiment.

FIG. 4 depicts a schematic cross-sectional view of a semiconductor device according to an embodiment. In particular, the semiconductor device of FIG. 4 can be manufactured using the exemplary method previously described with reference to FIGS. 2A through 2C and FIG. 3.

Referring to FIG. 4, the semiconductor device includes a semiconductor substrate 200 and a PMOS disposed on the semiconductor substrate 200. The semiconductor device further includes an embedded silicon germanium layer 201 disposed on opposite sides of a gate electrode 20 of the PMOS, and a capping layer 202 disposed on the embedded silicon germanium layer 201. The embedded silicon germanium layer 201 and the capping layer 202 are doped with boron (B).

In one embodiment, the atomic percentage of germanium (Ge) in the embedded silicon germanium layer 201 ranges from about 30% to about 50%, and the dopant concentration of boron (B) in the embedded silicon germanium layer 201 ranges from about $5\times10^{19}$ cm$^{-3}$ to about $3\times10^{20}$ cm$^{-3}$.

In one embodiment, the capping layer 202 is doped with germanium (Ge), and the atomic percentage of germanium (Ge) in the capping layer 202 ranges from about 1% to about 10%.

In one embodiment, the dopant concentration of boron (B) in the capping layer 202 ranges from about $5\times10^{19}$ cm$^{-3}$ to about $2\times10^{29}$ cm$^{-3}$.

In the exemplary semiconductor device of FIG. 4, since the capping layer 202 (disposed on top of the embedded silicon germanium layer 201) is doped with boron (B), the carrier concentrations in the source and drain regions of the PMOS can be increased, thereby improving device performance.

Specifically, in the embodiment of FIG. 4, the embedded silicon germanium layer 201 has a higher atomic percentage of germanium (Ge) than the embedded silicon germanium layer 101. Also, the capping layer 202 is doped with boron (B), unlike the capping layer 102 which is typically undoped. Accordingly, the carrier concentrations in the source and drain regions of the PMOS can be increased using the above exemplary structure, thereby improving the performance of the PMOS device.

It is noted that the semiconductor device of FIG. 4, or a semiconductor device manufactured using the method of FIG. 3, may be incorporated into an electronic apparatus. The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices. Specifically, the semiconductor devices can be formed on an integrated circuit that is then incorporated into the electronic apparatus.

Embodiments of a semiconductor device and a method of manufacturing the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of manufacturing a semiconductor device, comprising:
    forming a plurality of trenches in a semiconductor substrate, on opposite sides of a gate electrode of a P-type metal-oxide-semiconductor (PMOS) disposed on the semiconductor substrate;
    forming an embedded silicon germanium layer inside the trenches;
    doping the embedded silicon germanium layer with boron (B) having a first dopant concentration; then
    forming an undoped silicon layer directly on the embedded silicon germanium layer; then
    doping the undoped silicon layer with boron (B) having a second dopant concentration;
    and then
    lightly doping the undoped silicon layer with germanium (Ge), and an atomic percentage of the germanium (Ge) in the undoped silicon layer is from about 1% to about 10%.
    wherein the first dopant concentration is greater than the second dopant concentration,
    wherein an atomic percentage of germanium (Ge) in the embedded silicon germanium layer ranges from about 30% to about 50%, and
    wherein an atomic percentage of germanium (Ge) in the embedded silicon germanium layer is greater than the atomic percentage of germanium (Ge) in the undoped silicon layer.

2. The method according to claim 1, wherein a dopant concentration of the boron (B) in the embedded silicon germanium layer ranges from about $5 \times 10^{19}$ cm$^{-3}$ to about $3 \times 10^{20}$ cm$^{-3}$.

3. The method according to claim 1, wherein forming the embedded silicon germanium layer further includes:
    forming the embedded silicon germanium layer using a selective epitaxy method at temperatures ranging about 500° C. to about 800° C. and at pressures ranging from about 1 Torr to about 100 Torr.

4. The method according to claim 3, wherein the selective epitaxy method includes using reactive gases comprising $SiH_4$, HCl, $B_2H_6$, $GeH_4$, or $H_2$, and
    wherein a gas flow rate of the $SiH_4$, HCl, $B_2H_6$, or $GeH_4$ ranges from about 1 sccm to about 1000 sccm, and a gas flow rate of the $H_2$ ranges from about 0.1 slm to about 50 slm.

5. The method according to claim 3, wherein the selective epitaxy method includes using reactive gases comprising DCS ($SiH_2Cl_2$), HCl, $B_2H_6$, $GeH_4$, or $H_2$, and
    wherein a gas flow rate of the DCS ($SiH_2Cl_2$), HCl, $B_2H_6$, or $GeH_4$ ranges from about 1 sccm to about 1000 sccm, and a gas flow rate of the $H_2$ ranges from about 0.1 slm to about 50 slm.

6. The method according to claim 1, wherein a dopant concentration of the boron (B) in the capping layer ranges from about $5 \times 10^{19}$ cm$^{-3}$ to about $2 \times 10^{20}$ cm$^{-3}$.

* * * * *